(12) United States Patent
Nishimura et al.

(10) Patent No.: US 7,899,335 B2
(45) Date of Patent: Mar. 1, 2011

(54) OPTICAL TRANSMITTER CIRCUIT

(75) Inventors: Kazuko Nishimura, Kyoto (JP);
Hiroshi Kimura, Hyogo (JP)

(73) Assignee: Panasonic Corporation, Osaka (JP)

( * ) Notice: Subject to any disclaimer, the term of this patent is extended or adjusted under 35 U.S.C. 154(b) by 690 days.

(21) Appl. No.: 11/793,626

(22) PCT Filed: Aug. 17, 2005

(86) PCT No.: PCT/JP2005/015023
§ 371 (c)(1),
(2), (4) Date: Jun. 20, 2007

(87) PCT Pub. No.: WO2006/067890
PCT Pub. Date: Jun. 29, 2006

(65) Prior Publication Data
US 2008/0138086 A1    Jun. 12, 2008

(30) Foreign Application Priority Data
Dec. 22, 2004    (JP) ................................ 2004-371395

(51) Int. Cl.
*H01S 3/00* (2006.01)
*H03K 171/78* (2006.01)
(52) U.S. Cl. ................. 398/192; 398/182; 372/38.02
(58) Field of Classification Search ................. 398/192, 398/182; 372/38.02
See application file for complete search history.

(56) References Cited

U.S. PATENT DOCUMENTS

| | | | | |
|---|---|---|---|---|
| 7,369,590 B2 * | 5/2008 | Kubota | | 372/38.02 |
| 7,386,023 B2 * | 6/2008 | Rees et al. | | 372/38.02 |
| 2003/0020444 A1 * | 1/2003 | Kamenicky | | 323/315 |
| 2003/0086456 A1 * | 5/2003 | Tatehara et al. | | 372/38.02 |
| 2003/0189961 A1 * | 10/2003 | Tsuji et al. | | 372/38.02 |
| 2004/0017717 A1 * | 1/2004 | Morishima | | 365/205 |
| 2005/0105574 A1 * | 5/2005 | Wu et al. | | 372/38.07 |
| 2005/0123013 A1 * | 6/2005 | Nishimura | | 372/38.03 |
| 2005/0195870 A1 * | 9/2005 | Moran | | 372/38.02 |
| 2005/0195871 A1 * | 9/2005 | Moran | | 372/38.02 |
| 2005/0213622 A1 * | 9/2005 | Diaz | | 372/38.02 |
| 2005/0243879 A1 * | 11/2005 | Horiuchi et al. | | 372/38.07 |
| 2006/0104323 A1 * | 5/2006 | Rees et al. | | 372/38.02 |

FOREIGN PATENT DOCUMENTS

| | | |
|---|---|---|
| JP | 5-218543 | 8/1993 |
| JP | 6-29161 | 4/1994 |
| JP | 8-46272 | 2/1996 |

* cited by examiner

*Primary Examiner* — Ken N Vanderpuye
*Assistant Examiner* — Oommen Jacob
(74) *Attorney, Agent, or Firm* — McDermott Will & Emery LLP

(57) ABSTRACT

A light emitting element driving differential switch (2) includes first and second transistors (M1, M2). A third transistor (M3) is connected as an auxiliary switch in parallel to the first transistor (M1) whose drain is connected to a light emitting element (1). A third switch driving signal (IN3) is input to the third transistor (M3) to turn ON the third transistor (M3) at a slightly earlier point in time than when complementary switch driving signals (IN1, IN2) are input to the first and second transistors (M1, M2) to drive the first and second transistors (M1, M2). This improves the rising characteristics of the output from the light emitting element having a high power level.

13 Claims, 10 Drawing Sheets

OPTICAL TRANSMITTER CIRCUIT

RELATED APPLICATIONS

This application is the U.S. National Phase under 35 U.S.C. §371 of International Application No. PCT/JP2005/015023, filed on Aug. 17, 2005, which in turn claims the benefit of Japanese Application No. 2004-371395, filed on Dec. 22, 2004, the disclosures of which Applications are incorporated by reference herein.

TECHNICAL FIELD

The present invention relates to an optical transmitter circuit with a waveform shaping function.

BACKGROUND ART

With the recent advancements in the information telecommunication technology, the speed of optical transmission, the capacity thereof and the transmission distance thereof have been increasing, thus requiring a very advanced transmission technology. For example, one form of the optical transmission technology is the PON (Passive Optical Network) system. In this system, one switching office is connected to a plurality of subscriber premises based on time division multiplexing. Also with the transmission between the switching office and the subscriber premises, the distance and speed of data transmission have been increasing. Long-distance transmission requires a high power level to be transmitted, and it is therefore necessary to drive large currents. This increases the driving transistor size, thereby also increasing the load capacitance of the transistor and wires connected thereto. As a result, it is no longer possible to achieve a sufficient rising/falling response, and a fast response is difficult to realize. Where a receiver receives transmitted data, if data of insufficient rising/falling characteristics is received, pattern effects occur and the data quality may degrade through, for example, dropping of data.

In the prior art, optical transmitter circuits for transmitting data primarily employed the single driving method being superior in terms of the power consumption for low-speed communications. However, as the communications speed increases to 622 Mbps, 1.25 Gbps, . . . , the differential driving method is becoming the mainstream.

Under such circumstances, as an example of a measure for shaping the waveform of transmitted data, a technique is known in the art to control the amplitude of the input voltage to the laser diode driving differential switch transistors in connection with the amplitude of the modulation current to the laser diode (see Patent Document 1).

Patent Document 1: Japanese Laid-Open Patent Publication No. 5-218543

DISCLOSURE OF THE INVENTION

Problems to Be Solved by the Invention

The conventional differential driving method performs waveform shaping processes such as improving the blunting of the waveform according to the driving current and suppressing the overshoot. However, since the conventional differential driving method controls differential switch transistors with switch driving circuits having the same capacity and complementary outputs in order to realize a symmetric eye pattern, it is not possible to improve the data waveform while focusing on the rising (or falling) characteristics, and it is difficult to realize sufficient rising (or falling) characteristics when the communications speed increases over 1 Gbps.

Means For Solving the Problems

In order to solve the above problem, the present invention employs a configuration where an auxiliary switch transistor is connected in parallel to one of two transistors together forming a light emitting element driving differential switch. For example, a signal for driving the auxiliary switch transistor is input at an earlier point in time than signals for driving the differential switch transistors. Alternatively, the signal for driving the auxiliary switch transistor has an amplitude greater than those of the signals for driving the differential switch transistors. Alternatively, the capacity of the switch driving circuit for driving the auxiliary switch transistor is greater than the capacity for driving the differential switch transistors. Alternatively, the signal for driving the auxiliary switch transistor has a DC voltage level higher than those of the signals for driving the differential switch transistors. Alternatively, the signal for driving the auxiliary switch transistor has a high-level period longer than those of the signals for driving the differential switch transistors.

EFFECTS OF THE INVENTION

By employing a configuration of the present invention as described above, it is possible to drive and output waveform-shaped signals that rise (or fall) sharply, whereby it is possible to realize a stable optical communications system in which the data quality does not degrade even in high-speed, long-distance transmission.

DESCRIPTION OF REFERENCE NUMERALS

Figure 1:
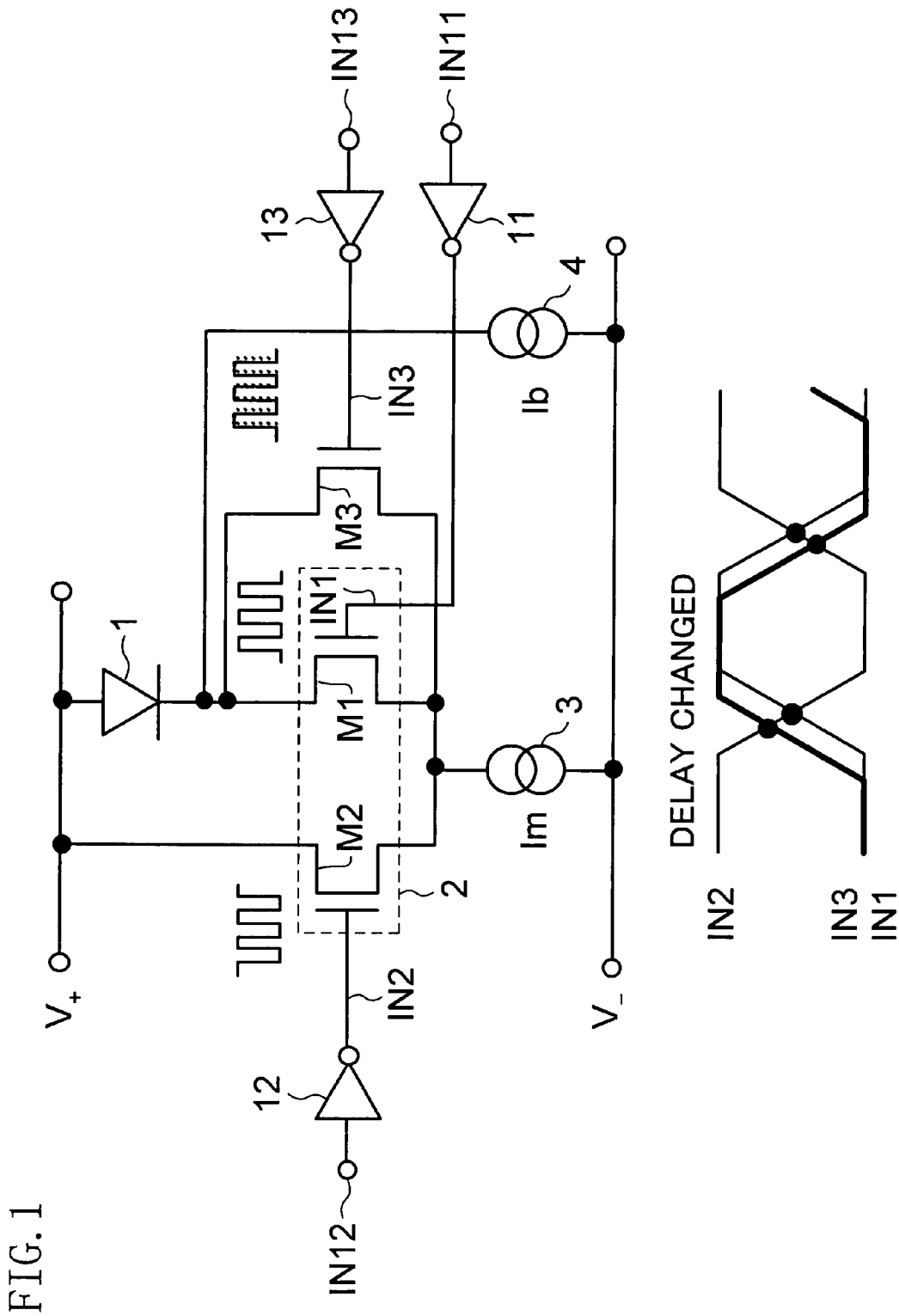
FIG. 1 is a circuit diagram showing an optical transmitter circuit according to a first embodiment of the present invention.

1 Light emitting element
2 Light emitting element driving differential switch

3 Modulation current source
4 Bias current source
11, 12, 13 Switch driving circuit with delay function
21, 22, 23 Switch driving circuit
31, 32, 33 Switch driving circuit
41, 42, 43 Switch driving circuit
51, 52 Switch driving circuit
53 Switch driving circuit with duty adjustment function
61, 62 Switch driving circuit with delay function
63 Switch driving circuit with delay function and duty adjustment function
71, 72, 73 Switch driving circuit
IN1, IN2, IN3 Switch driving signal
IN11, IN12, IN13 Switch driving circuit input signal
M1, M2 Light emitting element driving differential switch transistor
M3 Light emitting element driving auxiliary switch transistor
VB2 Bias voltage (fixed voltage)

BEST MODE FOR CARRYING OUT THE INVENTION

First Embodiment

FIG. 1 shows an optical transmitter circuit according to a first embodiment of the present invention. The present optical transmitter circuit includes a light emitting element 1 being a laser diode (LD), or the like, a light emitting element driving differential switch 2 including first and second transistors M1 and M2 whose sources are commonly connected, a third transistor M3 connected in parallel to the first transistor M1 to form an auxiliary switch, a modulation current source 3 of a current Im connected to the sources of the first, second and third transistors M1, M2 and M3, a bias current source 4 for supplying a bias current Ib to the LD 1, and switch driving circuits 11, 12 and 13 with a delay function for driving the first, second and third transistors M1, M2 and M3, respectively. IN11, IN12 and IN13 are switch driving circuit input signals, IN1, IN2 and IN3 are switch driving signals, and V+ and V− are power supply voltages. FIG. 1 also shows, together with the circuit configuration, the waveforms of the switch driving signals IN1, IN2 and IN3.

The configuration will now be described. First, when the first transistor M1 whose drain is connected to the LD 1 is turned ON by the first switch driving signal IN1 and the second transistor M2 is turned OFF by the second switch driving signal IN2, the current Ib set by the bias current source 4 is added to the current Im set by the modulation current source 3 and flows to the LD 1, where the LD 1 performs a current-light conversion to output light. Then, when the first transistor M1 is turned OFF by the first switch driving signal IN1 and the second transistor M2 is turned ON by the second switch driving signal IN2, the current Im set by the modulation current source 3 no longer flows to the LD 1. Therefore, only the current Ib set by the bias current source 4 flows to the LD 1, where the LD 1 performs a current-light conversion to output light. Thus, communication data H and L are produced and transmitted by turning ON/OFF the current Im set by the modulation current source 3.

Since the first and second transistors M1 and M2 need to drive large currents, the transistor size thereof is on the order of 1 mm, and therefore the gate capacitance of the first and second transistors M1 and M2 and the capacitance of the lines connected to these transistors M1 and M2 are very large. Therefore, if the LD 1 is driven as it is, the waveform does not sharply rise (or fall). In view of this, the third transistor M3 is added as an auxiliary switch in parallel to the first transistor M1, and the third switch driving signal IN3 is input from the switch driving circuit 13 with a delay function to the third transistor M3 slightly earlier than when the complementary switch driving signals IN1 and IN2 are input from the switch driving circuits 11 and 12 with a delay function to the first and second transistors M1 and M2 to drive the first and second transistors M1 and M2. With such a configuration, it is possible to start driving the current to the LD 1 earlier than the response of the first and second transistors M1 and M2, thereby improving the rising characteristics.

While the complementary switch driving signals IN1 and IN2 are input to the first and second transistors M1 and M2 and only the third transistor M3 receives the switch driving signal IN3 at an earlier point in time, the timing is not limited thereto as long as the rising characteristics are improved. Instead of employing a differential input method for inputting the switch driving signals IN1 and IN2 to the first and second transistors M1 and M2, different amounts of delay may be used.

The signals IN1 and IN3 may be input to the first and third transistors M1 and M3 simultaneously, if it produces better results.

While the three switch driving circuits 11, 12 and 13 with a delay function are used to drive the first, second and third transistors M1, M2 and M3, a single switch driving circuit may be used to produce three driving signals to drive the first, second and third transistors M1, M2 and M3.

The delay adjustment function may be realized by means of all the switch driving circuits 11, 12 and 13 with a delay function, or the delay amount may be fixed to a constant value for one or two of the switch driving circuits and the delay may be adjusted by using the rest of the switch driving circuits with a delay function.

Second Embodiment

Figure 2:
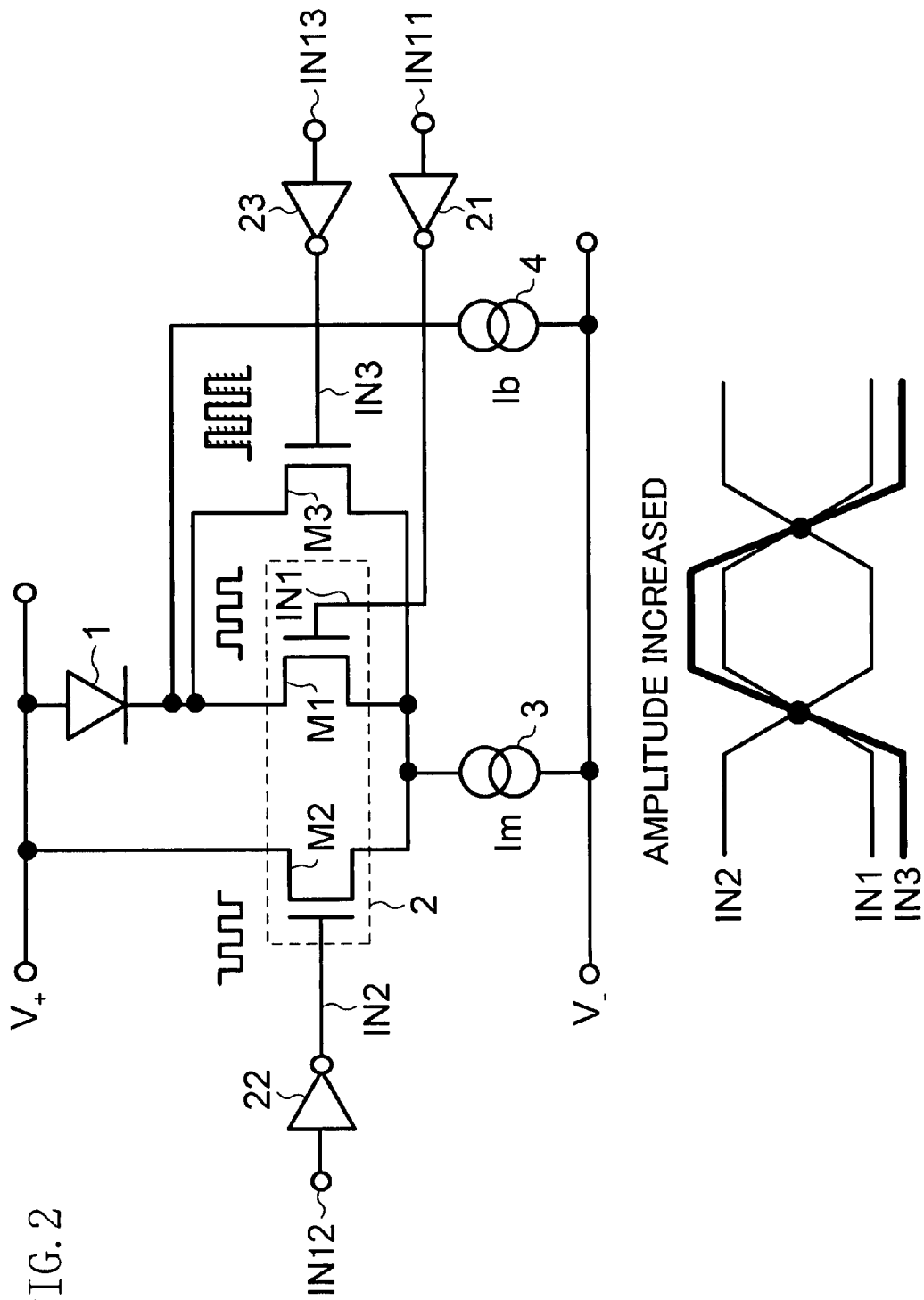
FIG. 2 is a circuit diagram showing an optical transmitter circuit according to a second embodiment of the present invention.

FIG. 2 shows an optical transmitter circuit according to a second embodiment of the present invention. The present optical transmitter circuit is similar to the optical transmitter circuit of the first embodiment, except that the configuration employs ordinary switch driving circuits 21, 22 and 23 with no delay function instead of the switch driving circuits 11, 12 and 13 with a delay function for driving the first, second and third transistors M1, M2 and M3, wherein signals output from the switch driving circuits 21, 22 and 23 differ from one another in the data amplitude. While the ordinary switch driving circuits 21, 22 and 23 are used herein, switch driving circuits with a delay function may be used.

In the second embodiment, the amplitude of data output from the third switch driving circuit 23 for driving the third transistor M3 is produced to be greater than those of data output from the first and second switch driving circuits 21 and 22 for driving the first and second transistors M1 and M2. Thus, the capacity for turning ON the first transistor M1 is reinforced by the third transistor M3 to be greater than the capacity for turning OFF the second transistor M2, thereby improving the rising capacity and thus realizing sharp rising characteristics.

Alternatively, the amplitude of data output from the first switch driving circuit 22 for driving the second transistor M2 may be produced to be less than those of data output from the first and third switch driving circuits 21 and 23 for driving the first and third transistors M1 and M3 so that the capacity for turning OFF the second transistor M2 is less than the capacity for turning ON the first and third transistors M1 and M3, thereby weakening the falling capacity and thus realizing sharp rising characteristics.

Alternatively, the amplitudes of data output from the first and third switch driving circuits 21 and 23 may be equal to each other and greater than that of data output from the first switch driving circuit 22.

Third Embodiment

Figure 3:
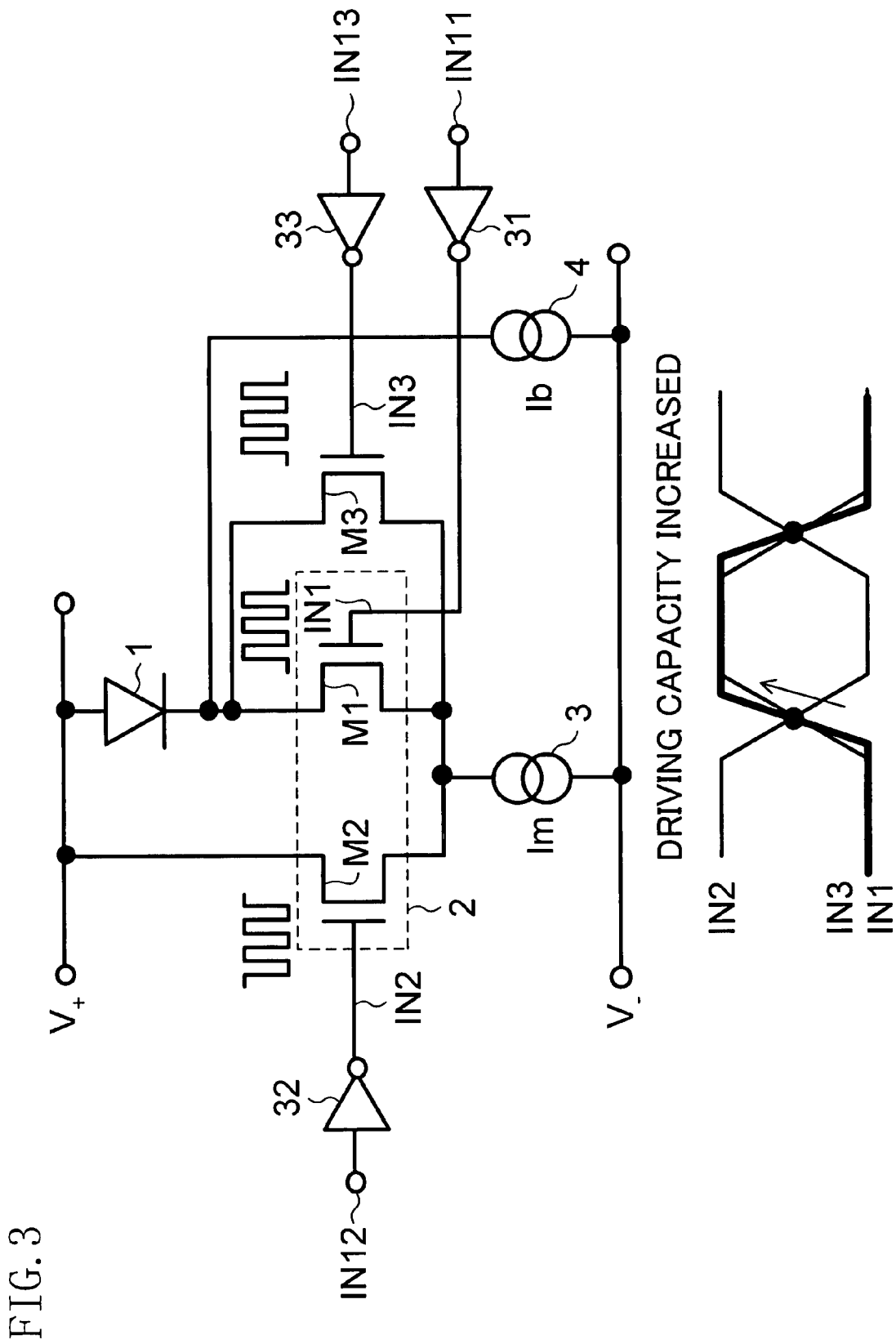
FIG. 3 is a circuit diagram showing an optical transmitter circuit according to a third embodiment of the present invention.

FIG. 3 shows an optical transmitter circuit according to a third embodiment of the present invention. The present optical transmitter circuit is similar to the optical transmitter circuit of the first embodiment, except that the configuration employs ordinary switch driving circuits 31, 32 and 33 with no delay function instead of the driving circuits 11, 12 and 13 with a delay function for driving the first, second and third transistors M1, M2 and M3, wherein the switch driving circuits 31, 32 and 33 differ from one another in the driving capacity. While the ordinary switch driving circuits 31, 32 and 33 are used herein, switch driving circuits with a delay function may be used.

In the third embodiment, the driving capacity of the third switch driving circuit 33 for driving the third transistor M3 is set to be greater than that of the first and second switch driving circuits 31 and 32 for driving the first and second transistors M1 and M2. Thus, the capacity for turning ON the first transistor M1 is reinforced by the third transistor M3 to be greater than the capacity for turning OFF the second transistor M2, thereby realizing sharp rising characteristics.

Alternatively, the driving capacities of the first and third switch driving circuits 31 and 33 may be equal to each other and greater than that of the second switch driving circuit 32.

Fourth Embodiment

Figure 4:
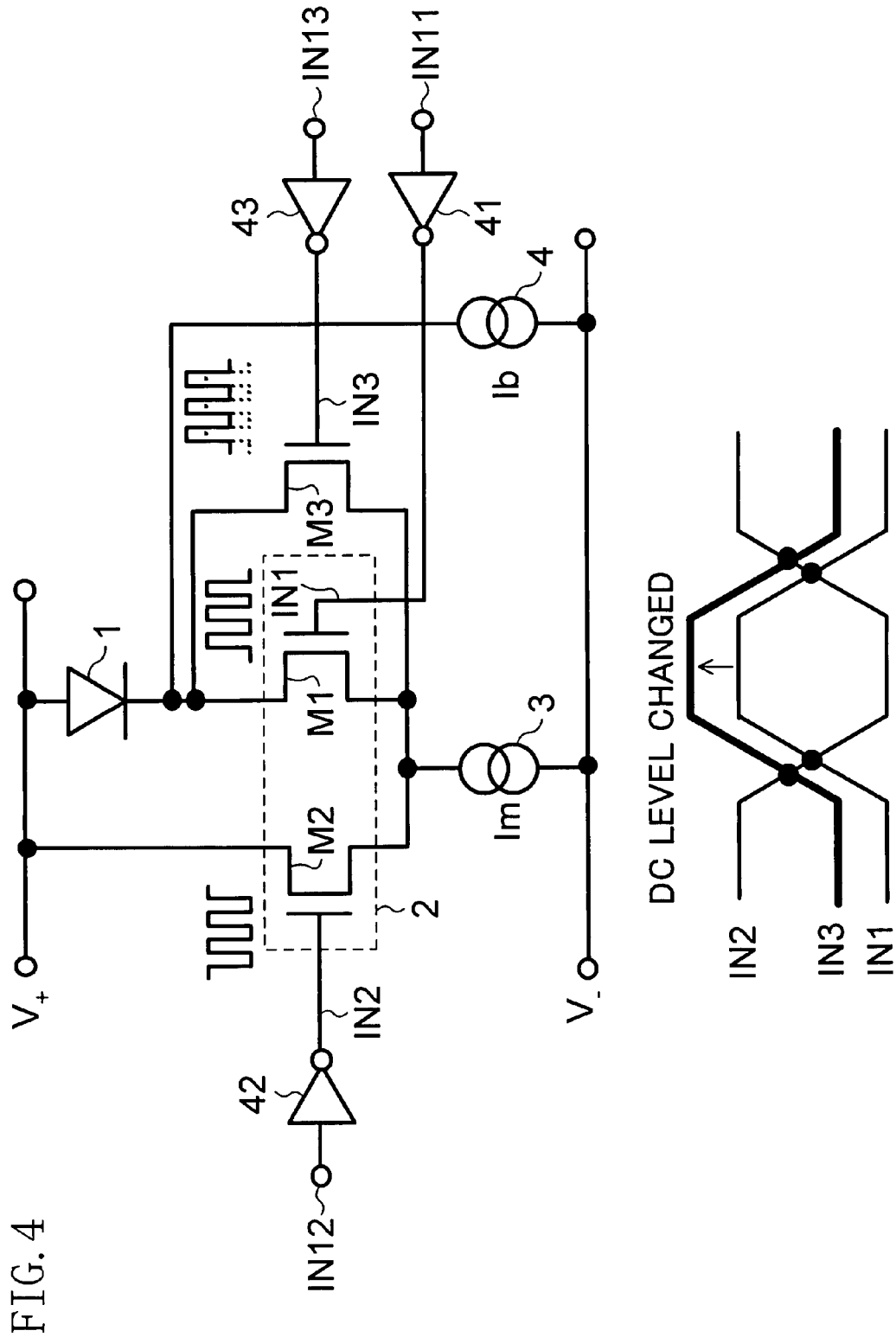
FIG. 4 is a circuit diagram showing an optical transmitter circuit according to a fourth embodiment of the present invention.

FIG. 4 shows an optical transmitter circuit according to a fourth embodiment of the present invention. The present optical transmitter circuit is similar to the optical transmitter circuit of the first embodiment, except that the configuration employs ordinary switch driving circuits 41, 42 and 43 with no delay function instead of the switch driving circuits 11, 12 and 13 with a delay function for driving the first, second and third transistors M1, M2 and M3, wherein the switch driving circuits 41, 42 and 43 differ from one another in the DC level of the output signal therefrom. While the ordinary switch driving circuits 41, 42 and 43 are used herein, switch driving circuits with a delay function may be used.

In the fourth embodiment, the DC level of the signal output from the third switch driving circuit 43 for driving the third transistor M3 is set to be higher than that of the signals output from the first and second switch driving circuits 41 and 42 for driving the first and second transistors M1 and M2. Therefore, the third transistor M3 starts to turn ON and the current starts to be driven to the LD 1 earlier than the response of the first and second transistors M1 and M2, thus realizing sharp rising characteristics.

Alternatively, the DC levels of the signals output from the first and third switch driving circuits 41 and 43 may be equal to each other and higher than that of the signal output from the second switch driving circuit 42.

Fifth Embodiment

Figure 5:
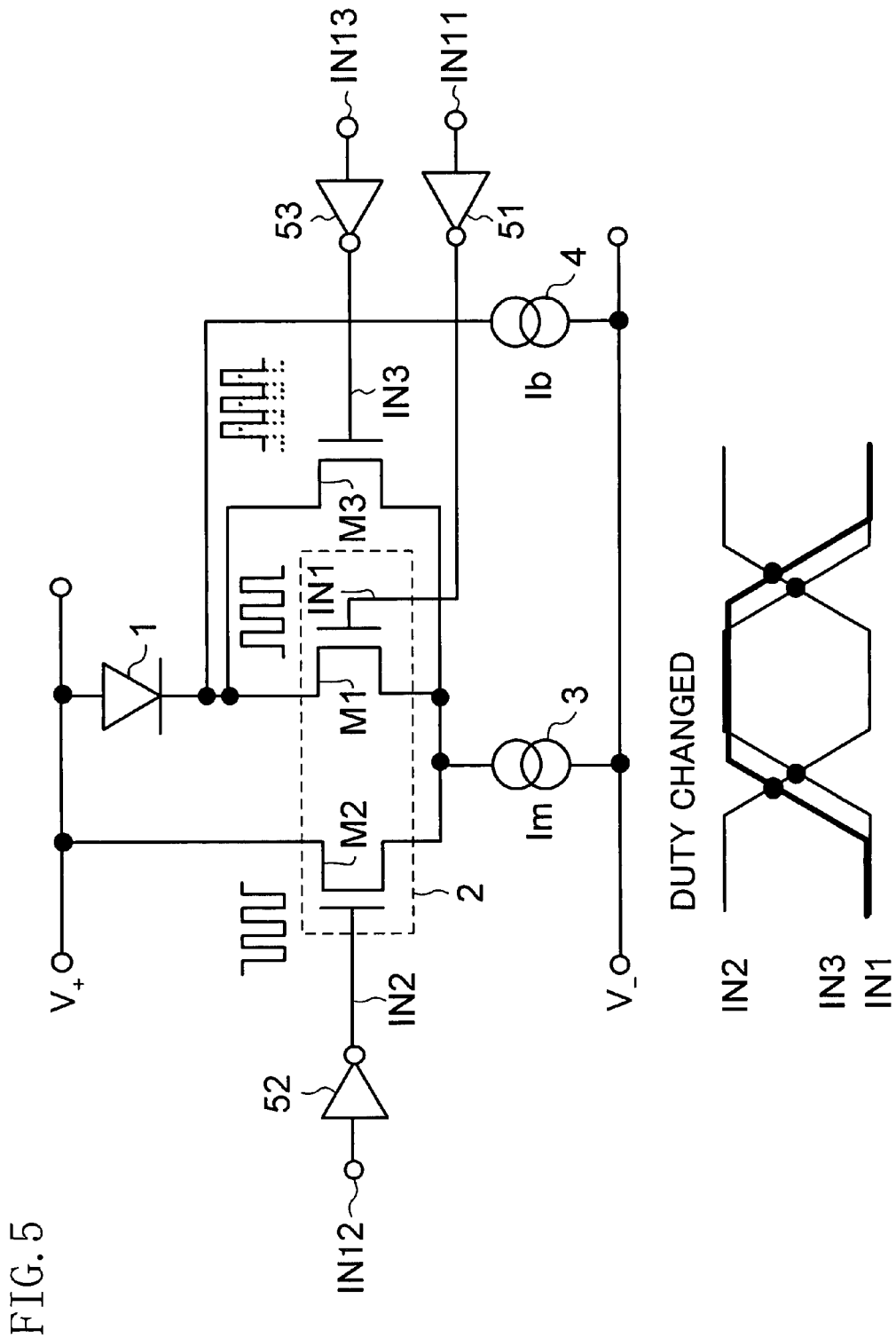
FIG. 5 is a circuit diagram showing an optical transmitter circuit according to a fifth embodiment of the present invention.

FIG. 5 shows an optical transmitter circuit according to a fifth embodiment of the present invention. The present optical transmitter circuit is similar to the optical transmitter circuit of the first embodiment, except that the configuration employs ordinary switch driving circuits 51 and 52 with no delay function and a switch driving circuit 53 with a duty adjustment function instead of the switch driving circuits 11, 12 and 13 with a delay function for driving the first, second and third transistors M1, M2 and M3, wherein the switch driving circuits 51, 52 and 53 differ from one another in the duty of the signal output therefrom.

In the fifth embodiment, the duty of the signal output from the third switch driving circuit 53 for driving the third transistor M3 is changed so that the high-level period is longer than those of the signals output from the first and second switch driving circuits 51 and 52 for driving the first and second transistors M1 and M2. Therefore, the third transistor M3 starts to turn ON and the current starts to be driven to the LD 1 earlier than the response of the first and second transistors M1 and M2, thus realizing sharp rising characteristics.

The configurations of the first to fifth embodiments may each be used alone, or more than one of them may be combined together as illustrated in the sixth and seventh embodiments below. With combined configurations, the rising characteristics of the waveform of the output from the light emitting element are further improved, and it is possible to realize problem-free driving output waveform (e.g., without degradation in the falling characteristics).

Sixth Embodiment

Figure 6:
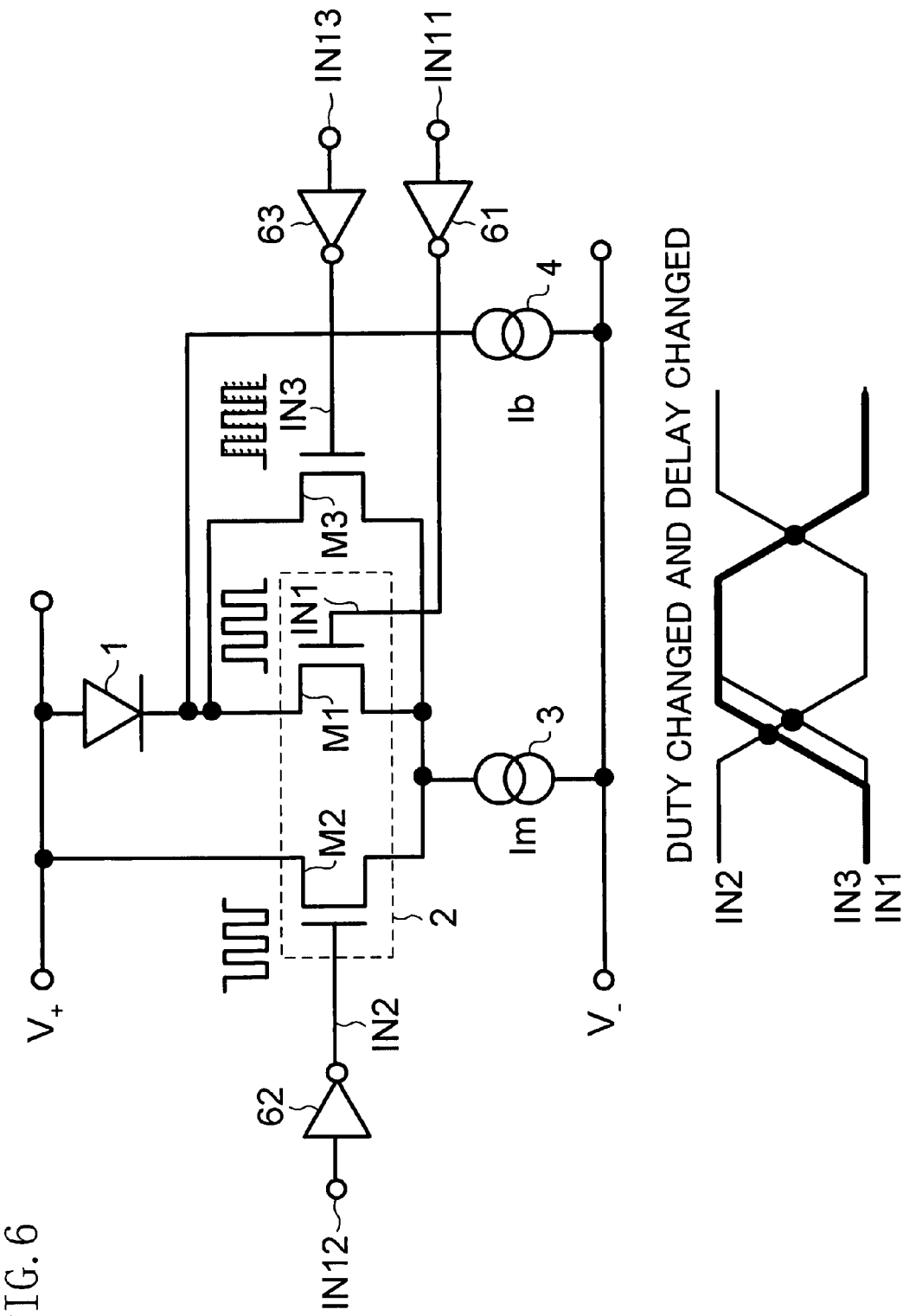
FIG. 6 is a circuit diagram showing an optical transmitter circuit according to a sixth embodiment of the present invention.

FIG. 6 shows an optical transmitter circuit according to a sixth embodiment of the present invention. The present optical transmitter circuit is a combination of the first embodiment and the fifth embodiment. In FIG. 6, 61 and 62 are switch driving circuits with a delay functions, and 63 is a switch driving circuit with a delay function and a duty adjustment function.

Seventh Embodiment

Figure 7:
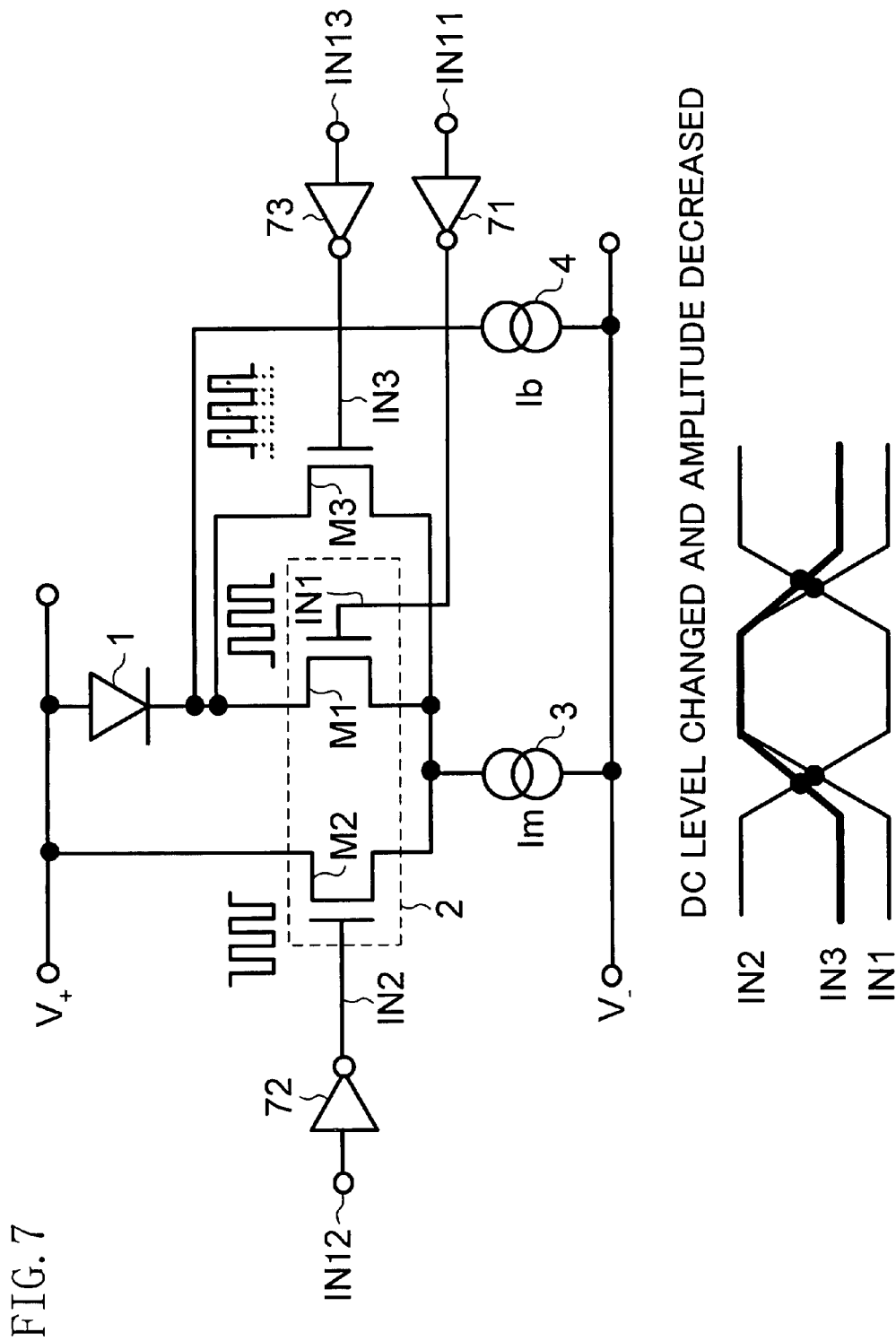
FIG. 7 is a circuit diagram showing an optical transmitter circuit according to a seventh embodiment of the present invention.

FIG. 7 shows an optical transmitter circuit according to a seventh embodiment of the present invention. The present optical transmitter circuit is a combination of the second embodiment and the fourth embodiment. In FIG. 7, 71, 72 and 73 are switch driving circuits.

The following variations can be applied to each of the embodiments above. Herein, only the variations to the first embodiment will be described with reference to the drawings.

First Variation

Figure 8:
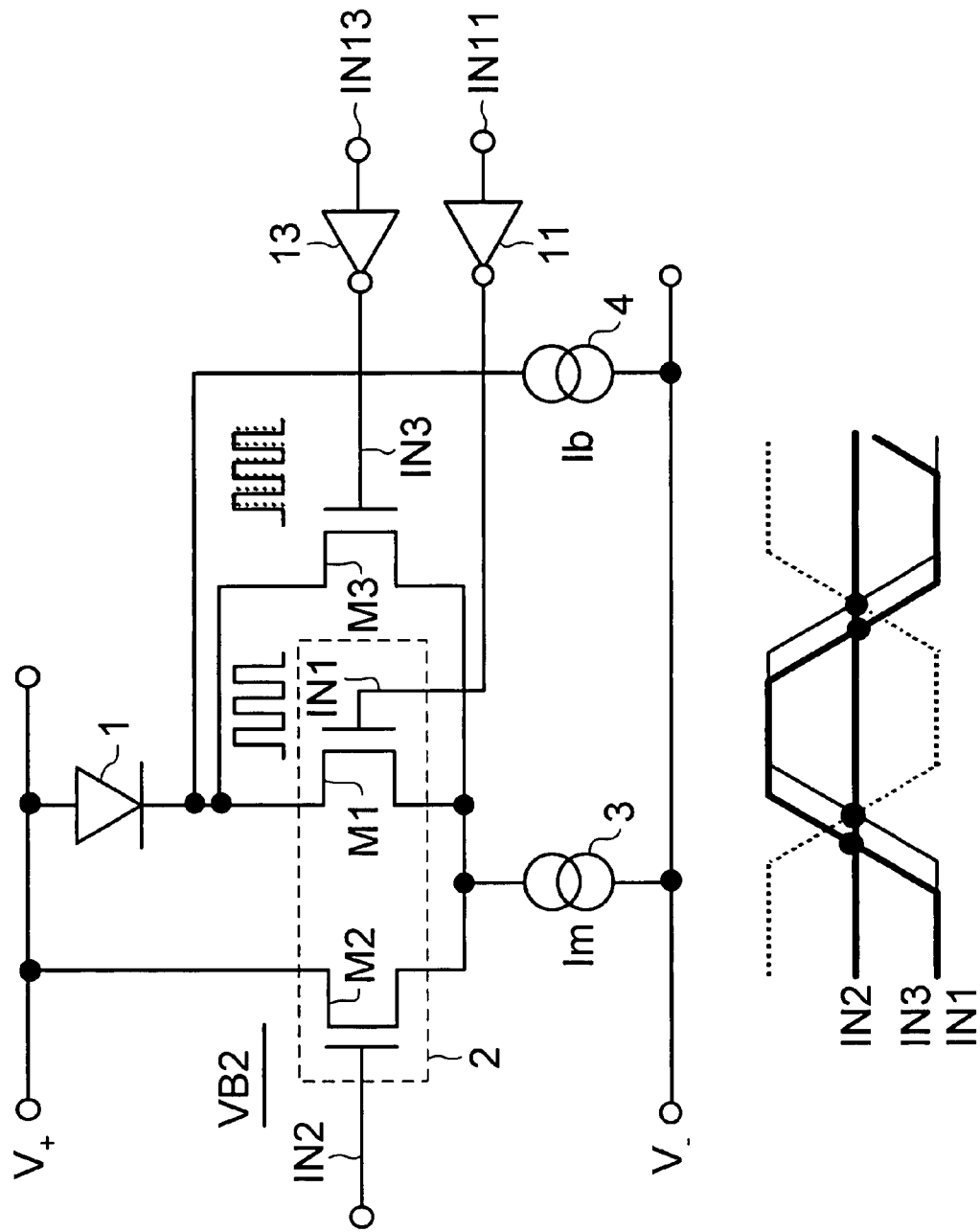
FIG. 8 is a circuit diagram showing an optical transmitter circuit according to a first variation of the present invention.

As shown in FIG. 8, the input of the second transistor M2 may be a predetermined fixed voltage VB2.

Second Variation

In the preceding embodiments, the switch transistor M3 of a similar configuration is added to the existing configuration, and the input thereof is adjusted so as to improve the rising characteristics. Note that the addition of the switch transistor M3 is equivalent to changing the driving capacity of the differential switch 2 itself, and can provide significantly greater improving effects than altering the control signals to the light emitting element driving differential switch transistors M1 and M2.

Figure 9:
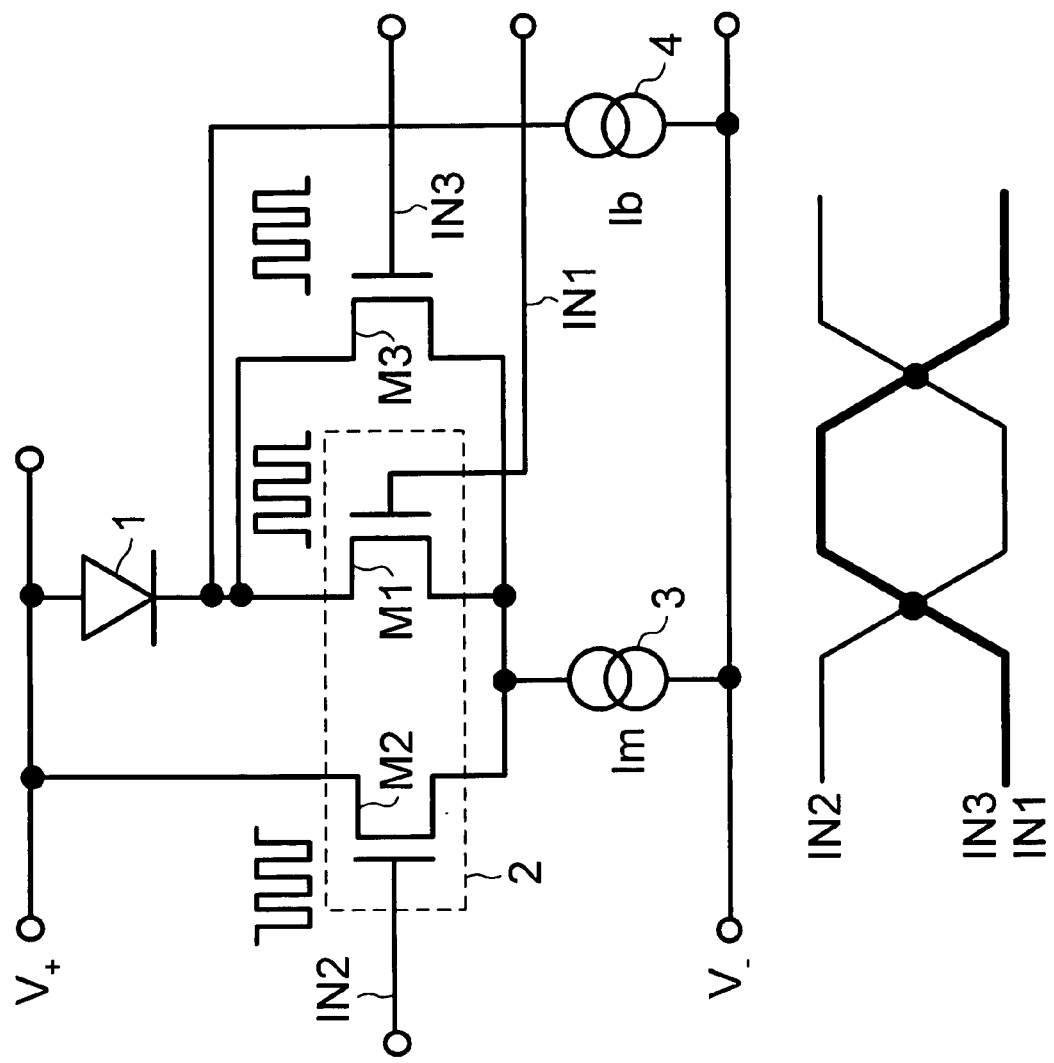
FIG. 9 is a circuit diagram showing an optical transmitter circuit according to a second variation of the present invention.

Therefore, only by adding the third transistor M3 as shown in FIG. 9, the driving capacity of the light emitting element driving differential switch 2 itself is changed, and the capacity for turning ON the combined transistor of the first and third transistors M1 and M3 is greater than the capacity for turning OFF the second transistor M2, thus realizing sharp rising characteristics.

Third Variation

Figure 10:
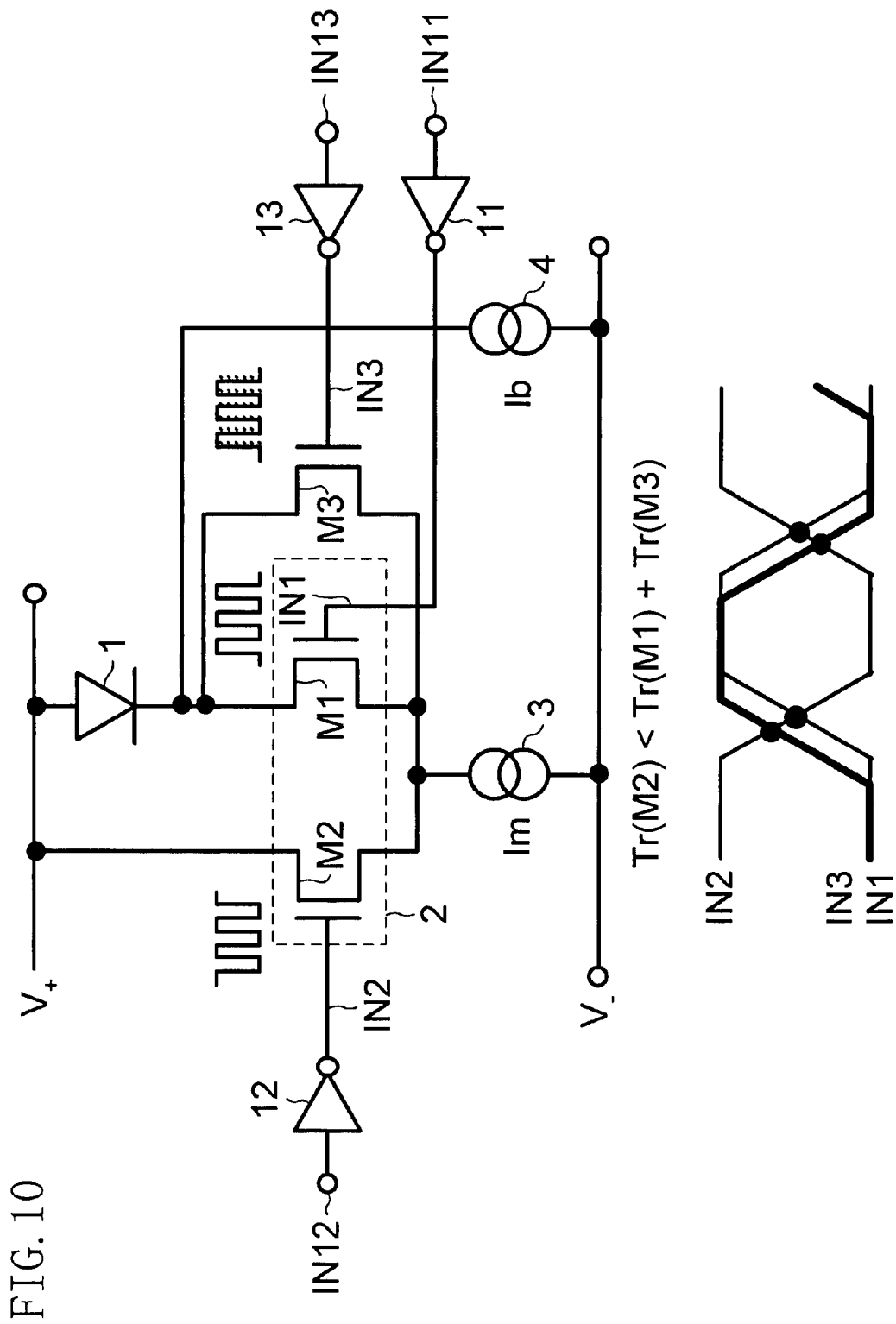
FIG. 10 is a circuit diagram showing an optical transmitter circuit according to a third variation of the present invention.

The sum of the size of the first transistor M1 and that of the third transistor M3 may be set to be greater than the size of the second transistor M2 as shown in FIG. 10. Then, the capacity for turning ON the first transistor M1 is reinforced by the third transistor M3 to be greater than the capacity for turning OFF the second transistor M2, thereby improving the rising capacity and thus realizing sharp rising characteristics.

Only the third transistor M3 may have a larger size while employing the same small size for the first and second transistors M1 and M2 as a differential switch, or the sum of the size of the first transistor M1 and that of the third transistor M3 may be made greater than the size of the second transistor M2.

Moreover, if the first and third transistors M1 and M3 and the second transistor M2 are configured so that they differ from each other only in the transistor size while employing similar circuit configurations and similar layouts, the rising characteristics are improved while maintaining the waveform symmetry, whereby it is possible to realize a more optimal output waveform.

While the above description is directed to how to improve the rising characteristics, if it is desired to improve the falling characteristics, a fourth transistor may be added as an auxiliary switch in parallel to the second transistor M2, instead of adding the third transistor M3.

INDUSTRIAL APPLICABILITY

The optical transmitter circuit of the present invention is an optical transmitter circuit having a waveform shaping function, and is applicable to optical communications devices in general.

The invention claimed is:

1. An optical transmitter circuit, comprising:
a light emitting element;
a light emitting element driving differential switch including a first transistor whose drain is connected to the light emitting element and a second transistor whose source is connected to a source of the first transistor;
a third transistor whose drain and source are connected to the drain and the source of the first transistor, respectively;
a modulation current source connected to sources of the first, second and third transistors;
a bias current source for supplying a bias current to the light emitting element; and
switch driving circuits, each of which drives one of the first, second and third transistors.

2. The optical transmitter circuit of claim 1, wherein a signal for driving the third transistor is input at a point in time earlier than signals for driving the first and second transistors.

3. The optical transmitter circuit of claim 1, wherein a signal for driving the third transistor has an amplitude different from that of at least one of the signals for driving the first and second transistors.

4. The optical transmitter circuit of claim 3, wherein the signal for driving the third transistor has a greater amplitude than those of the signals for driving the first and second transistors.

5. The optical transmitter circuit of claim 1, wherein a capacity of the switch driving circuit for driving the third transistor is different from at least one of those for driving the first and second transistors.

6. The optical transmitter circuit of claim 5, wherein a capacity of the switch driving circuit for driving the third transistor is greater than those for driving the first and second transistors.

7. The optical transmitter circuit of claim 1, wherein a signal for driving the third transistor has a DC voltage level different from that of at least one of signals for driving the first and second transistors.

8. The optical transmitter circuit of claim 7, wherein the signal for driving the third transistor has a DC voltage level higher than those of the signals for driving the first and second transistors.

9. The optical transmitter circuit of claim 1, wherein a signal for driving the third transistor has a duty different from that of at least one of signals for driving the first and second transistors.

10. The optical transmitter circuit of claim 9, wherein the signal for driving the third transistor has a high-level period longer than those of the signals for driving the first and second transistors.

11. The optical transmitter circuit of one of claims 1, 2, 3, 5, 7 and 9, wherein a signal for driving the second transistor is connected to a fixed voltage.

12. An optical transmitter circuit, comprising:
a light emitting element;
a light emitting element driving differential switch including a first transistor whose drain is connected to the light emitting element and a second transistor whose source is connected to a source of the first transistor;
a third transistor whose drain and source are connected to the drain and the source of the first transistor, respectively;
a modulation current source connected to sources of the first, second and third transistors; and
a bias current source for supplying a bias current to the light emitting element.

13. The optical transmitter circuit of one of claims 1, 2, 3, 5, 7, 9 and 12, wherein a sum of a size of the first transistor and that of the third transistor is greater than a size of the second transistor.

* * * * *